United States Patent [19]

Sonoda et al.

[11] Patent Number: 4,884,082

[45] Date of Patent: Nov. 28, 1989

[54] COLOR IMAGE RECORDING APPARATUS

[75] Inventors: Takakuni Sonoda; Kazunori Tanabe; Morikazu Iwase; Kazuo Sangyoji, all of Nagoya; Tokunori Kato, Ichinomiya, all of Japan

[73] Assignee: Brother Kogyo Kabushiki Kaisha, Aichi, Japan

[21] Appl. No.: 184,576

[22] Filed: Apr. 21, 1988

[30] Foreign Application Priority Data

| Apr. 24, 1987 | [JP] | Japan | 62-102182 |
| Apr. 28, 1987 | [JP] | Japan | 62-105843 |
| Jul. 17, 1987 | [JP] | Japan | 62-110376[U] |
| Jul. 24, 1987 | [JP] | Japan | 62-186138 |
| Aug. 26, 1987 | [JP] | Japan | 62-212329 |
| Sep. 18, 1987 | [JP] | Japan | 62-235973 |

[51] Int. Cl.⁴ .................................................. G01D 15/00
[52] U.S. Cl. ................................. 346/105; 346/107 R
[58] Field of Search ................. 430/138, 42, 44, 211; 346/157, 160, 139 R, 108, 107 R, 105, 106; 355/4; 101/471

[56] References Cited

U.S. PATENT DOCUMENTS

| 4,399,209 | 8/1983 | Sanders et al. | 430/138 |
| 4,440,846 | 4/1984 | Sanders et al. | 430/138 |
| 4,518,246 | 5/1985 | Spitzner et al. | 355/4 |
| 4,772,922 | 9/1988 | Kawahara et al. | 355/4 |

Primary Examiner—Arthur G. Evans
Attorney, Agent, or Firm—Parkhurst, Oliff & Berridge

[57] ABSTRACT

A photosensitive recording medium is exposed to light through mask members produced from color image information thereby to form a color image. A color image recording apparatus includes an inlet for receiving a monochromatic image recording sheet from a monochromatic image recording apparatus capable of producing the mask members, a discharge path for discharging the monochromatic image recording sheet which has been received through the inlet, a supply path for receiving and supplying the monochromatic image recording sheet to an image generator in the color image recording apparatus, and a path selector for selecting one, at a time, of the discharge path and the supply path.

11 Claims, 12 Drawing Sheets

COLOR IMAGE RECORDING APPARATUS

BACKGROUND OF THE INVENTION

The present invention relates to an image output apparatus for outputting an image on a photosensitive recording medium using mask members formed by color separation, and more particularly to a color image recording apparatus which is to be used in combination with a monochromatic printer for producing a color image.

Conventional image recording apparatus are classified into electrophotographic recording apparatus, ink-jet recording apparatus, thermal transfer recording apparatus, and other recording apparatus. In these recording apparatus, a color image is reproduced and recorded on a sheet of paper, for example, based on color image information.

Image recording apparatus employing a photosensitive pressure-sensitive sheet of paper as a photosensitive recording medium have been proposed in order to solve the problems of the high price of an electrophotographic copying apparatus, the high running cost of such an apparatus due to the maintenance of a photosensitive body and other parts, or the long period of time required to produce photoprints in a silver salt photographic system. In the image recording apparatus, mask members are first produced which monochromatically record images thereon based on red, green, an blue image information which has been supplied as input signals from an image scanner or the like. Then, the photosensitive pressure-sensitive sheet is exposed to light successively through the mask members. After the exposure, the photosensitive pressure-sensitive sheet is pressed to fix a color image thereon. The contrast of the output image can be adjusted by adjusting the amount of light to which the mask members are exposed.

One known color image recording apparatus employing mask members will be described in more detail with reference to FIG. 1 of the accompanying drawings. The recording apparatus has a mask member generators 41 for generating mask members and a color image recorder 42. The mask member generator 41 comprises a laser printer of the electrophotographic type. The mask member generator 41 has a polygonal scanner 2, a photosensitive body 3, an image developing unit 4, a sheet feed cassette 5, and an image fixing unit 6. The color images recorder 62 has an exposure light source 21, an intermediate sheet 22, an intermediate sheet discharge tray 23, a photosensitive pressure-sensitive sheet 24 of paper, a color image sheet discharge tray 25, a thermal fixing unit 26, a color developer sheet cassette 27, a pressure developing unit 28, an intermediate sheet resist roll 31, and an intermediate sheet positioning device 32.

The polygonal scanner 2 applies a laser beam to the photosensitive body 3 that has been charged, for thereby forming an electrostatic latent image thereon. The electrostatic latent image on the photosensitive body 3 is then developed into a visible toner image by the image developing unit 4, and the toner image is thereafter transferred onto a sheet of plain paper or an OHP sheet which is supplied from the sheet feed cassette 5. The toner image is then fixed to the sheet by the image fixing unit 6.

For recording a color image on a sheet using the color image recording apparatus which employs mask members, the color image recording apparatus as shown in FIG. 1 must be purchased even if the user has already had a monochromatic recording apparatus capable of forming mask members. Mask members which are employed in the color image recording apparatus can easily be produced by a monochromatic recording apparatus, which can also produce black-and-white images.

Demands for reproduction of color images are not so often in normal usage of the apparatus. Therefore, the purchase of such two different recording apparatus may be too costly, and require a large installation space.

More specifically, many laser printers for producing monochromatic hard copies have already been available in the market. Therefore, in the event that the user already has such a laser printer, the purchase of a color image recording apparatus which is also capable of producing monochromatic images, in order to obtain color images, would result in the possesion of two monochromatic printers, which would be a waste of money and space.

Co-pending U.S. patent application Ser. No. 50,313 has been filed on May 14, 1987. Other co-pending U.S. patent applications have been filed on February 23, 1988 (U.S. Ser. No. 159,296), and on March 25, 1988 (U.S. Ser. No. 173,610).

SUMMARY OF THE INVENTION

In view of the aforesaid drawbacks of the conventional color image recording apparatus, it is an object of the present invention to provide a color image recording apparatus for recording a color image using monochromatic mask members produced from color image information, the color image recording apparatus being combinable with a monochromatic image recording apparatus which has already been owened by the user so that the monochromatic image recording apparatus can be used alone for producing a monochromatic image or can be used with the color image recording apparatus for producing a color image, these two modes being selectable, one at a time, by a simple switching operation.

To achieve the above object, there is provided in accordance with the present invention a color image recording apparatus for exposing a photosensitive recording medium to light through mask members produced from color image information thereby to form a color image, the color image recording apparatus including an inlet for receiving a monochromatic image recording sheet from a monochromatic image recording apparatus capable of producing the mask members, a discharge path for discharging the monochromatic image recording sheet which has been received through the inlet, a supply path for receiving and supplying the monochromatic image recording sheet to an image generator in the color image recording apparatus, and selector means for selecting one, at a time, of the discharge path and the supply path.

If the user already owns the monochromatic image recording apparatus, it can be used in combination with the color image recording apparatus of the invention for producing a color image. For producing a black-and-white image, the selector means is actuated to select the discharge path so that the monochromatic image recording apparatus operates as a monochromatic printer. For producing a color image, the monochromatic image recording apparatus is supplied with color image information such as R, G, B color imformation, for example, to form a plurality of mask members, and the selector means is actuated to select the supply path. The mask members are then successively fed into an exposure unit in the image generator, where a photosensitive recording medium is exposed to light through the mask members to form respective images on the photosensitive recording medium, which are then developed into a color image.

The above and other objects, features and advantages of the present invention will become more apparent from the following description when taken in conjunction with the accompanying drawings in which preferred embodiments of the present invention are shown by way of illustrative example.

DETAILED DESCRIPTION OF THE PREFERRED EMBODIMENTS

In a color image recording apparatus according to the present invention, a latent image is formed on a photosensitive drum by a first exposure unit based no image information, and then developed into a light-shielding visible image with toner by a first image developing unit. The visible image is thereafter transferred onto a light-transmissive member in the form of an endless transparent insulating film by an image transfer unit. As the light-transmissive member moves, the visible image is delivered over a photosensitive recording medium such as a photosensitive pressure-sensitive sheet of paper, for example. Then, diffusive light is applied to the photosensitive recording medium through the latent image on the light-transmissive member by a second exposure unit to form a latent image on the photosensitive recording medium. The latent image on the photosensitive recording medium is then developed into a visible image by a second image developing unit comprising pressure fixing rollers.

A color image recording apparatus according to a first embodiment of the present invention will be described below.

Figure 1:
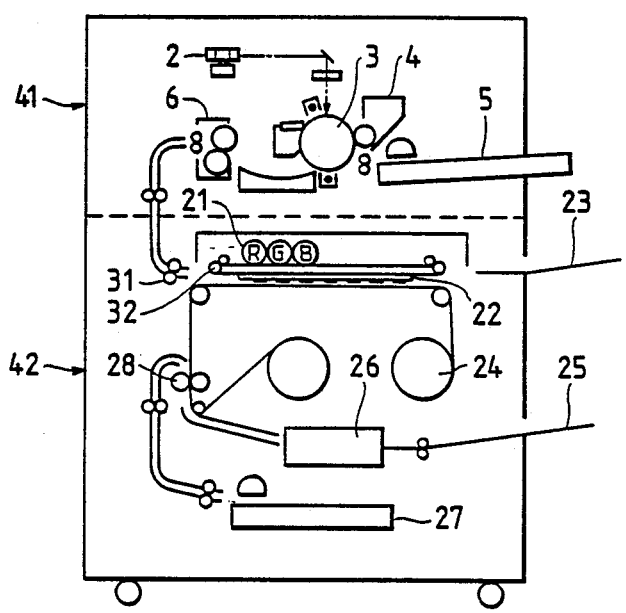
FIG. 1 is a schematic sectional elevational view of a conventional color image recording apparatus employing a photosensitive pressure-sensitive sheet of paper.
Figure 2:
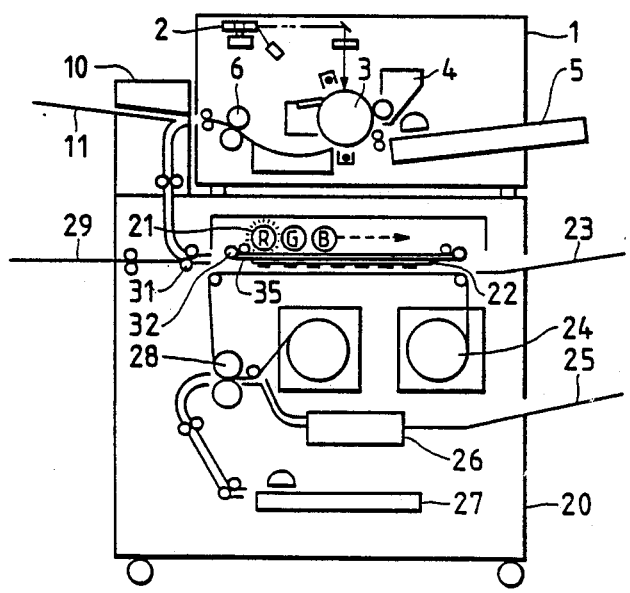
FIG. 2 is a schematic sectional elevational view of a color image recording apparatus according to a first embodiment of the present invention, the apparatus being combined with an existing monochromatic image recording apparatus.

FIG. 2 schematically shows, in sectional elevation, the color image recording apparatus of the first embodiment which is coupled to a monochromatic printer 1 which comprises a laser printer by way of example.

The monochromatic laser printer 1 records data transmitted from a host computer. The color image recording apparatus, generally designated by the reference numeral 10, records a color image using mask members prepared from color image information. When a monochromatic or black-and-white image output is needed, a sheet with a black-and-white image fixed is discharged from the monochromatic printer 1 onto a monochromatic image sheet discharge tray 11.

The color image recording apparatus 20 comprises a selector 10 for selecting a supply path for supplying mask members from the monochromatic printer 1 into an exposure unit in the apparatus 20, light sources 21 of three primaries for applying light to a microcapsule sheet or photosensitive pressure-sensitive sheet 24 through each mask member 22 (hereinafter also referred to as an "intermediate sheet") held in intimate contact with the microcapsule sheet 24, a color developer sheet storage unit 27 for storing color developer sheets each coated with a color developer which can develop colors in reaction with dye precursors contained in the pressure-rupturable microcapsules coated on the microcapsule sheet 24, pressure developing rollers 28 for pressing a color developer sheet and the microcapsule sheet 24 together in overlapping relation to develop a color image, a thermal fixing unit 26 for promoting color development, a color image sheet discharge tray 25, and a manual insertion tray 29 for allowing an intermediate sheet to be manually inserted into the apparatus 20.

Figure 3:
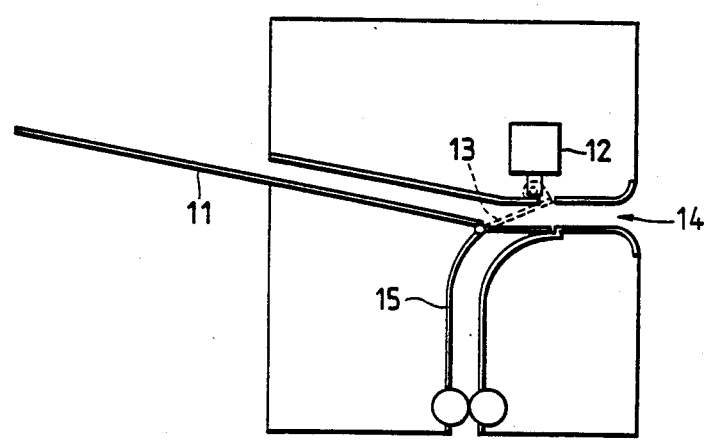
FIG. 3 is an enlarged sectional elevational view of a path selector for selecting one, at a time, of supply and discharge paths for monochromatic and color image recording sheets.

The selector 10 is illustrated in detail in FIG. 3. The selector 10 has a chute 13 vertically movable by a solenoid 12 to select one, at a time, of a monochromatic or black-and-white image discharge path 11 and a color image supply path 15. An inlet 14 for an intermediate sheet has a wide slot which can be registered with the outlet slots of various printers which have different heights. The monochromatic printer 1 normally operates in a black-and-white mode in which a produced black-and-white image sheet is discharged onto the discharge tray 11.

A color mode will be described below. In the color mode, an intermediate sheet from the monochromatic printer 1 is supplied by the selector chute 13 via the supply path 15 to a positioning roller 31 which positions the leading end of the intermediate sheet. Thereafter, the intermediate sheet is positioned with respect to a photosensitive pressure-sensitive sheet by a positioning device 32 so that images of three primaries will not be brought out of mutual registration. The intermediate sheet 22 is electrostatically attached to an insulating sheet carrier 35 such as of PET trained around rollers by an electrostatic charge generator (not shown) such as a corotron. The microcapsule sheet 24 is exposed to light from the light sources 21 several times through intermediate sheets in an exposure unit, and then the intermediate sheet is discharged onto an intermediate sheet discharge tray 23. The latent images on the microcapsule sheet 24 are then developed into a visible color image by the pressure developing roller 28, and the visible color image is transferred onto a color developer sheet from the storage unit 27. The color developer sheet with the developer color image is then passed through the thermal fixing unit 26 onto the color image sheet discharge tray 25.

The monochromatic printer 1 is not limited to a laser printer, but may be any of various types such as an LED printer, a liquid crystal printer, or a thermal transfer printer, insofar as it can produce mask members of three primaries (R, G, and B). Where the monochromatic printer 1 is of the desk top type, it is mounted on the top of the color image recording apparatus. Where the monochromatic printer 1 is larger in size, it may be located on the side of the color image recording apparatus, and mask members produced thereby may be supplied through the manual insertion tray 29 into the apparatus 20 for recording a color image.

With the first embodiment of the present invention, as described above, the existing monochromatic image recording apparatus capable of producing mask members can be combined with the color image recording apparatus of the invention to provide a color image recorder.

Figure 4:
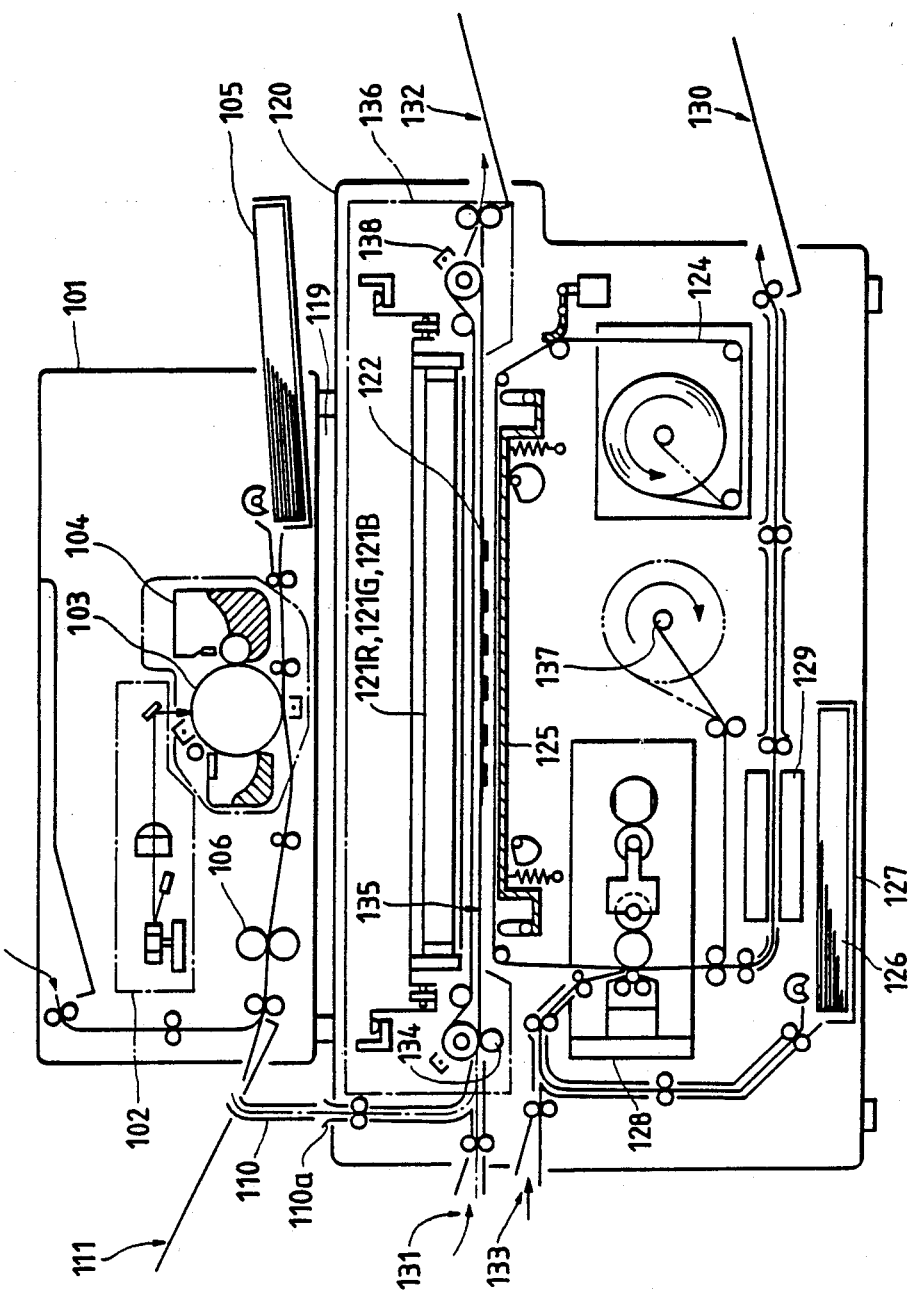
FIG. 4 is a schematic sectional elevational view of a color image recording apparatus according to a second embodiment of the present invention, the apparatus being combined with an existing laser printer.

FIG. 4 shows a color image recording apparatus 120 according to a second embodiment of the present invention, the apparatus 120 being coupled to a monochromatic laser printer 101. The monochromatic laser printer 101 is placed on the top of the apparatus 120. The laser printer 101 has a polygonal scanner 102 for applying a laser beam to a charged photosensitive body 103 to form an electrostatic latent image thereon. The electrostatic latent image on the photosensitive body 103 is then developed into a visible toner image by an image developing unit 104, and the toner image is transferred onto a sheet of plain paper or an OHP sheet supplied from a sheet cassette 105, after which the toner image is fixed to the sheet by a fixing unit 106. The monochromatic laser printer 101 is normally operated to record data transmitted from a host computer.

When a black-and-white image is required, an output image sheet from the laser printer 1 is fed onto a monochromatic image tray 111 or 112 through a sheet path selector 110. When a color image is desired, an output image sheet from the laser printer 1 is fed into the color image recording apparatus 120 by the sheet path selector 110. The sheet path selector 110 is available of several types to meet various commercial laser printers since the position of image sheet outlets varies from laser printer to laser printer.

The color image recording apparatus 120 shown in FIG. 4 records a color image by employing mask members produced on the basis of color image information.

More specifically, the color image recording apparatus 120 has a mount 110a on which the sheet path selector 110 is detachably mounted for supplying mask members or intermediate sheets 122R, 122G, 122B produced from the monochromatic laser printer 101 into an exposure unit 136, an exposure table 125 on which the intermediate sheet 122 is held in intimate contact with a microcapsule sheet or photosensitive pressure-sensitive sheet 124, exposure light sources 121R, 121G, 121B of three primaries, a color developer sheet storage unit 127 for storing color developer sheets 126 each coated with a color developer which can develop colors in reaction with dye precursors contained in the microcapsules coated on the photosensitie pressure-sensitive sheet 124, a pressure developing means 128 for pressing a color developer sheet 126 and the photosensitive pressure-sensitive sheet 124 together in overlapping relation to rupture those microcapsules which have not been photoset for thereby developing a color image on the color developer sheet 126, a thermal fixing unit 129 for promoting color development, a color image sheet discharge tray 130, a manual insertion tray 131 for allowing an intermediate sheet to be manually inserted into the apparatus 120, an intermediate sheet discharge tray 132 for receiving an exposed intermediate sheet 122 discharge from the apparatus 120, and a manual insertion tray 133 for allowing a color developer sheet to be manually inserted into the apparatus 120.

In a color mode, a mask member 122R produced by the monochromatic laser printer 101 is passed through the intermediate sheet path selector 110 toward a positioning roller 134 by which the leading end of the mask member 122R is positioned. The mask member 122R is electrostatically attached to an insulating sheet carrier 135 such as of PET trained around rollers by an electrostatic charge generator 138 such as a corotron, and is then fed into the exposure unit 136. By moving the sheet carrier 135, the mask member 122R can be positioned so that color latent images on the photosensitive pressure-sensitive sheet 124 will not be shifted out of mutual registration. In the exposure unit 136, the mask member 122R and the photosensitive pressure-sensitive sheet 124 are held in intimate contact with each other by the exposure table 125, and the photosensitive pressure-sensitive sheet 124 is exposed to light from the light source 121R through the mask member 122R for thereby producing a latent image corresponding to the mask member 122R on the photosensitive pressure-sensitive sheet 124. After the exposure, the mask member 122R is discharged onto the intermediate sheet discharge tray 132. The same process is also carried out successively for the mask members 122G, 122B to form color latent images on the photosensitive pressure-sensitive sheet 124. The exposed photosensitive pressure-sensitive sheet 124 is then superposed on a color developer sheet 126, and the latent images are developed into a color image by the pressure developing means 128. The color developer sheet 126 is then passed through the thermal fixing unit 129 and discharged onto the color image sheet discharge tray 130. The used photosensitive pressure-sensitive sheet 124 from which the images have been transferred is wound up by a takeup roll 137.

The monochromatic laser printer 101 is fixedly mounted on a support table 119. The sheet path selector 110 is of a type selected to match the type of the laser printer 110 used. The mask members 122 produced by the monochromatic laser printer 101 are successively introduced via the sheet path selector 110 into the color image recording apparatus 120. The mask members 122 are produced for three colors, i.e., red, green, and blue. If the period of time in which the photosensitive pressure-sensitive sheet 124 is exposed to light from the exposure light sources 121R, 121G, 121B through the mask members 122R, 122G, 122B in the apparatus 120 is longer than the period of time in which the mask members 122R, 122G, 122B are produced in the laser printer, then a control signal should be transmitted between the color image recording apparatus 120 and the laser printer 101 to synchronize them because unless the color image recording apparatus 120 were synchronized with the laser printer 101, a next mask member would come into the apparatus 120 before exposure through the previous mask member would be completed. Even if such synchronization is achieved, however, the laser printer is not available for another use while a color image is being recorded since the output from the laser printer 101 is queued. To avoid this problem, the processing time of the color image recording apparatus 120 is made shorter than the output time of the laser printer 101 so that mask members produced by the laser printer 101 can be accepted by the apparatus 120 at any time, with the result that no control signal is required to be transmitted between the laser printer 101 and the color image recording apparatus 120. A high-speed laser printer can be interfaced with the color image recording apparatus 120 by employing a buffer for mask members.

Figure 5:
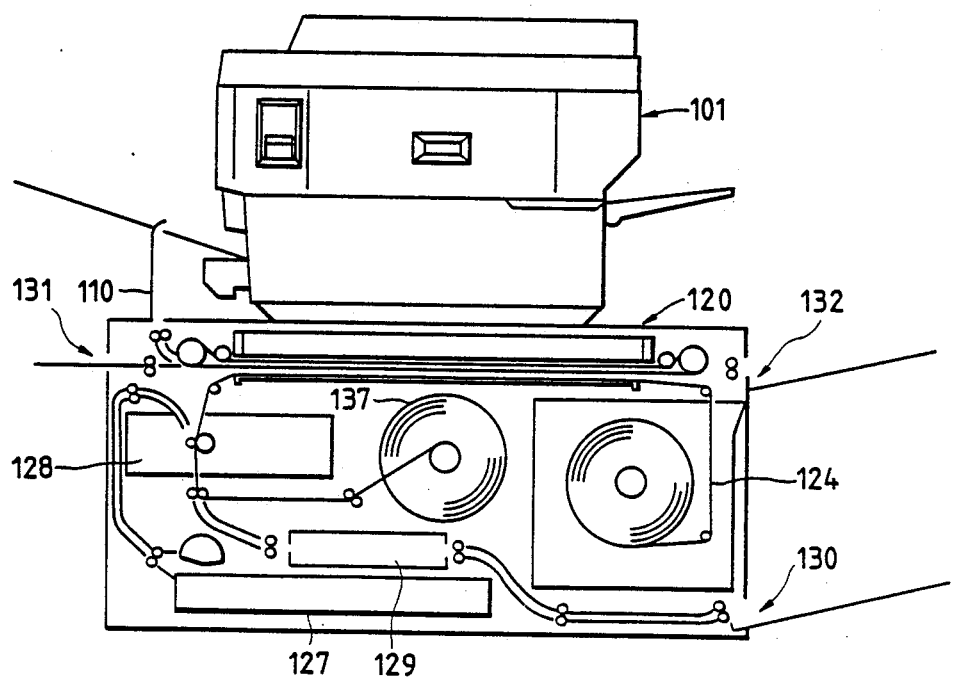
FIG. 5 is a view similar to FIG. 4, showing a third embodiment of the present invention.
Figure 6:
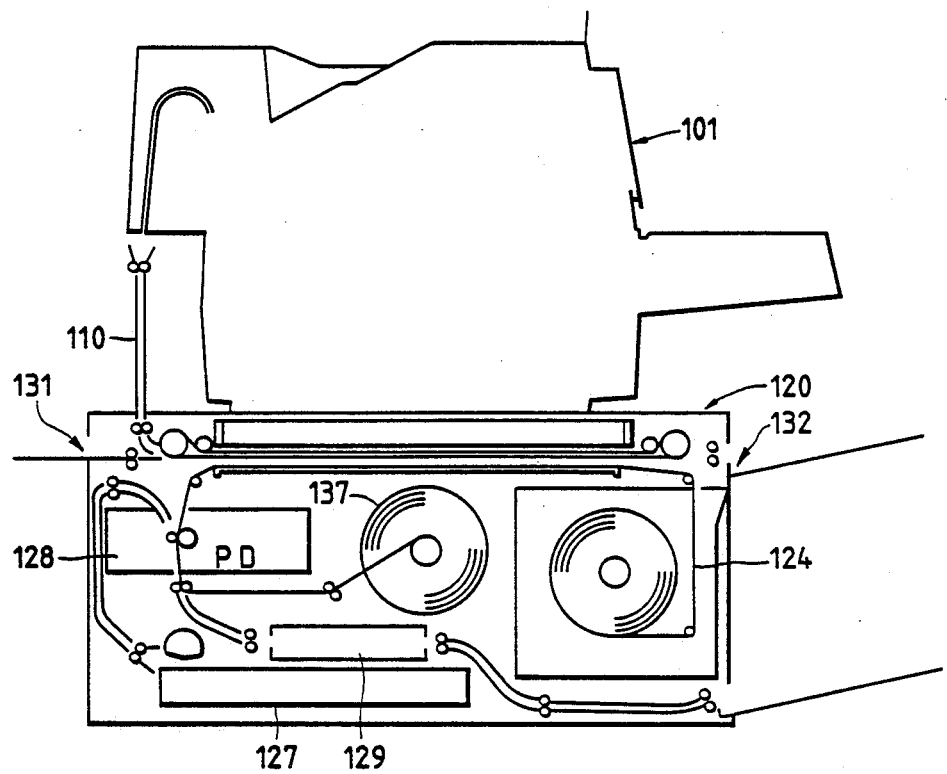
FIG. 6 is a view similar to FIG. 4, showing a fourth embodiment of the present invention.

FIGS. 5 and 6 illustrate color image recording apparatus according to third and fourth embodiments, respectively, with commercially available laser printers installed thereon. The color image recording apparatus of the third and fourth embodiments have expandable and contractable sheet passages, the length of which can be determined dependent on the distance between the sheet outlet of the laser printer and the sheet inlet of the color image recording apparatus.

In each of the first through fourth embodiments, the monochromatic printer is shown as being a laser printer, but may be a liquid crystal printer, an LED printer, an electrostaic printer, a thermal printer, or any of various other printers which can produce a monochromatic image output.

As described above, monochromatic printers of various types can be used as color printers in combination of the color image recording apparatus according to the first through fourth embodiments.

A color image recording apparatus according to a fifth embodiment of the present invention.

Figure 8:
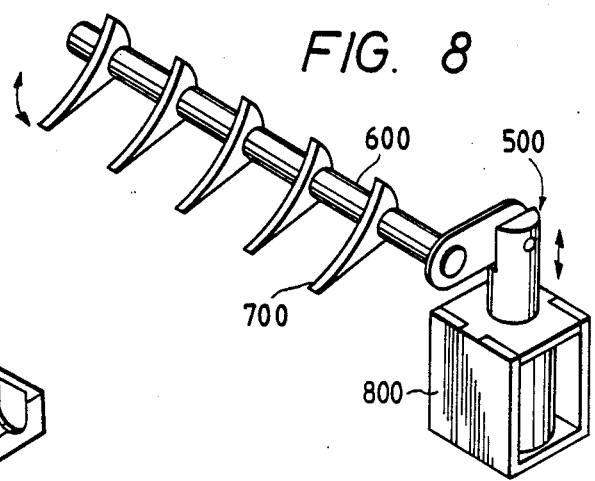
FIG. 8 is a perspective view of a selector unit for selecting one of sheets feed paths at a time in the color image recording apparatus of the fifth embodiment.
Figure 7:
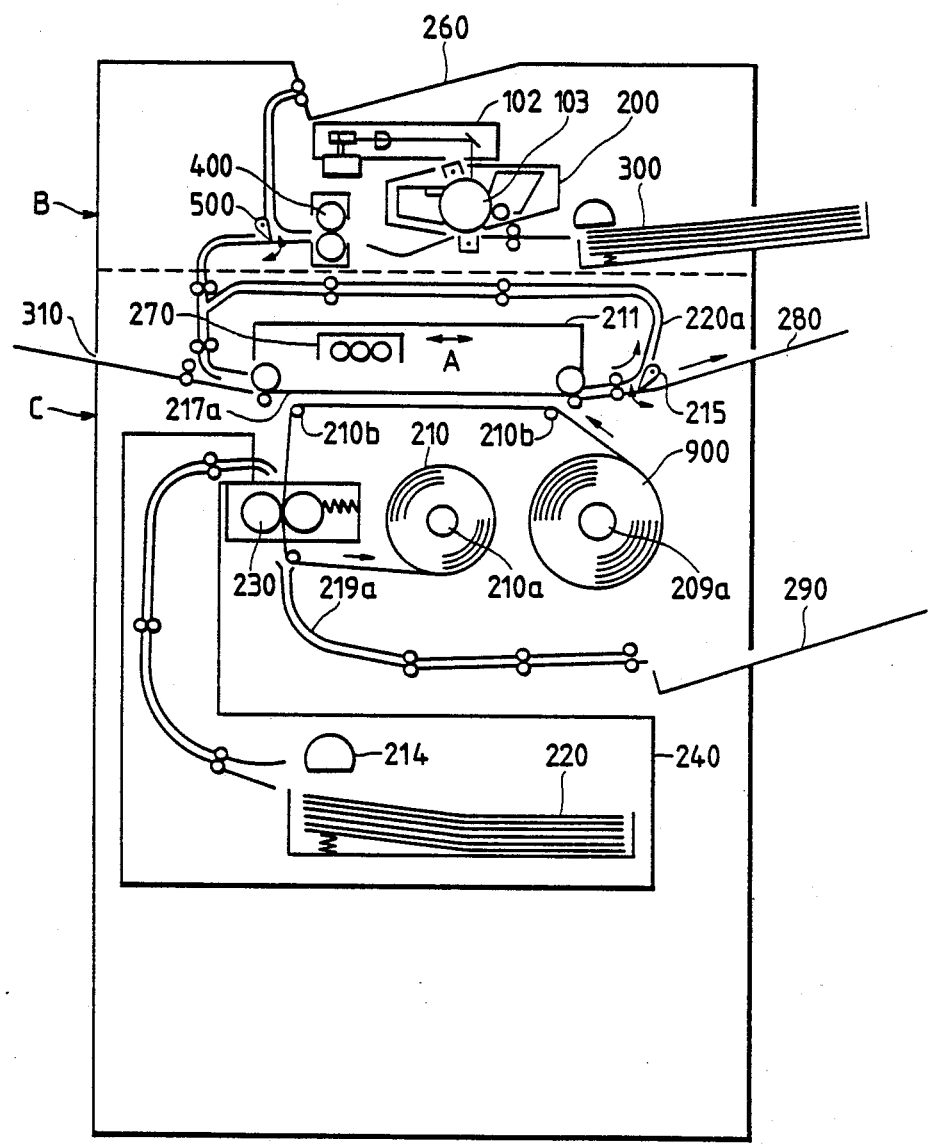
FIG. 7 is a schematic sectional elevational view of a color image recording apparatus according to a fifth embodiment of the present invention.

As shown in FIG. 7, the color image recording apparatus of the fifth embodiment generally comprises a laser printer B and a color printer C. The laser printer B includes a laser scanner unit 102 for writing data supplied from an external source as an optical signal on a photosensitive drum 103 to form a latent image thereon, a photosensitive unit 200 for successively developing the latent image with toner, transferring the developed toner image, and cleaning the photosensitive drum 103, a sheet feed unit 300 for feeding a light-transmissive sheet of plain paper into a transfer region, a thermal fixing unit 400 for thermally fixing the toner image transferred onto the plain paper sheet, and a selector unit 500 disposed behind the thermal fixing unit 400 for selecting one of sheet paths at a time. As shown in FIG. 8, the selector unit 500 has an array of fingers 700 mounted at axially spaced intervals on a shaft 600 which is angularly movable about its own axis by a solenoid 800. When the shaft 600 is turned about its own axis, the fingers 700 select one of the sheet paths at a time.

The color printer C comprises a support shaft 209a supporting a roll of an unused photosensitive pressure-sensitive microcapsule sheet 900, a takeup shaft 210a supporting a wound roll 210 of a used photosensitive pressure-sensitive microcapsule sheet 900, a feeder 210b for feeding the photosensitive pressure-sensitive microcapsule sheet 900, an exposure assembly 217a for securly positioning therein one mask member, at a time, from the laser printer B, an exposure unit 270 (see FIG. 9) having light sources R, G, B of three primaries for exposing the photosensitive pressure-sensitive microcapsule sheet 900 through the successive mask members held in intimate contact therewith in the exposure assembly 217a, a pressure developing unit 230 for receiving a color developer sheet 220 coated with a color developer which is supplied through a feed roller 214 and developing the latent images on the photosensitive pressure-sensitive microcapsule sheet 900 with the color developer into a color image on the color developer sheet 220 overlapping the photosensitive pressure-sensitive microcapsule sheet 900, a color developer sheet feed unit 240 for feeding the color developer sheet 220 into the pressure developing unit 230 through the feed roller 214, a selector unit 215 (which is of a structure identical to that of the selector unit 500 shown in FIG. 8) for feeding the exposed mask members selectively to a mask member discharge tray 280 outside of the color printer C or to a feed passage 220a for reentry into the exposure assembly 217a, and a manual insertion tray 310 for allowing the user to manually insert a mask member into the exposure assembly 217a.

Figure 10:
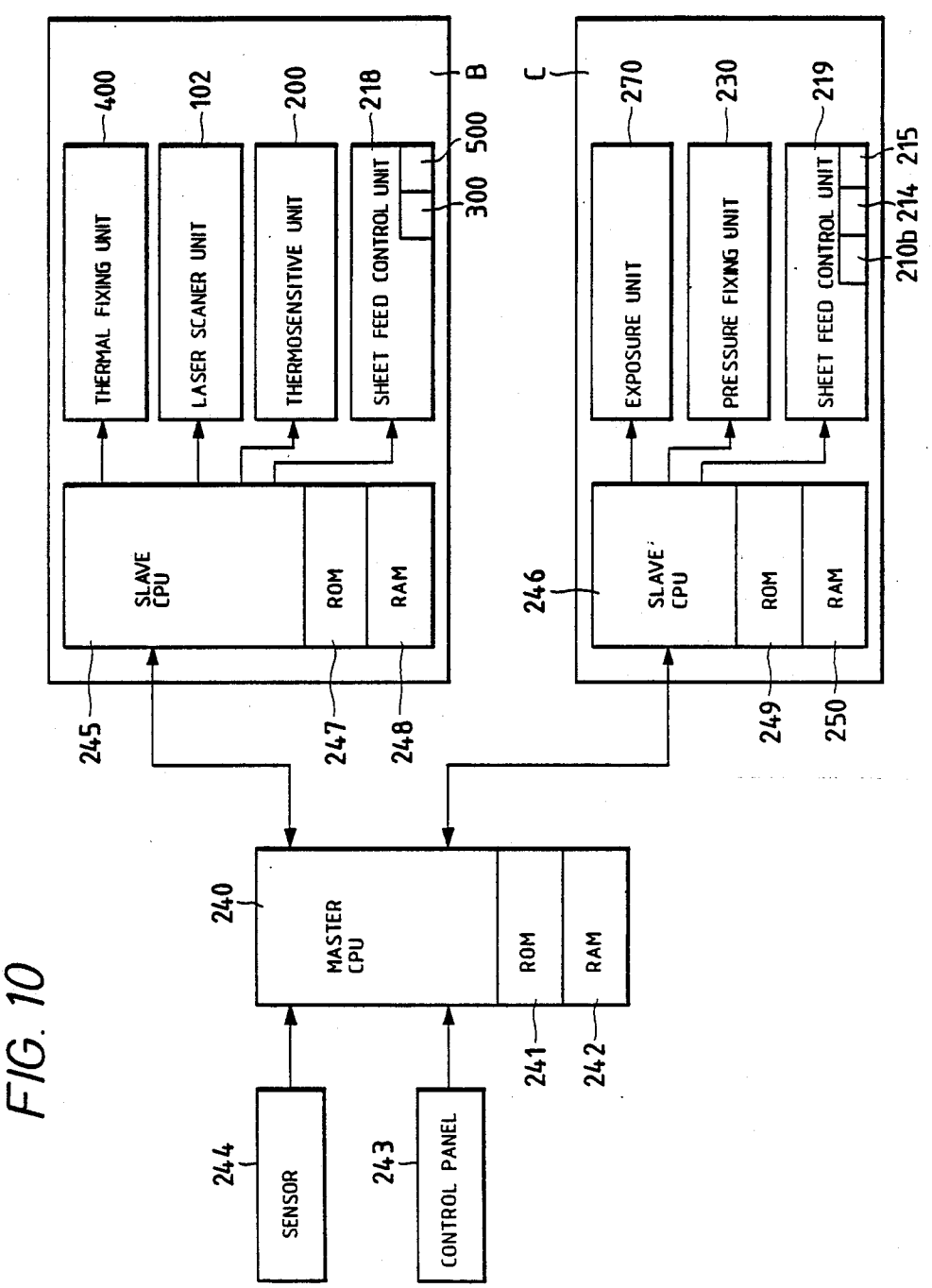
FIG. 10 is a block diagram of an electric arrangement of the color image recording apparatus of the fifth embodiment.

FIG. 10 shows an electric arrangement of the color image recording apparatus shown in FIG. 7.

A central processing unit (CPU) 240 for controlling the color image recording apparatus has a ROM 241 for storing a program for controlling the apparatus and a RAM 242 for storing data to control the apparatus. The CPU 240 receives input signals from a control panel 243 which is operated upon by the user when the apparatus is used, and signals from various sensors 244. The CPU 240 also controls a CPU 245 for controlling the laser printer B to produce mask members and a CPU 246 for controlling the color printer C. The CPU 245 has a ROM 247 and a RAM 248, whereas the CPU 246 has a ROM 249 and a RAM 250. The CPU 245 controls the thermal fixing unit 400, the laser scanner unit 102, the photosensitive unit 200, and a sheet feed control unit 218. The CPU 246 controls the exposure unit 270, the pressure fixing unit 230, and a sheet feed control unit 219.

Operation of the apparatus shown in FIG. 7 will be described with respect to four modes: (i) the output of a monochromatic image; (ii) the output of a single color image; (iii) the output of a plurality of identical color images; and (iv) the output of a color image from mask members which have been in storage.

(i) The output of a monochromatic image:

Only the laser printer B is operated on the basis of data supplied from an external device (not shown) to produce an image output. At this time, the output image sheet is discharged onto a monochromatic image sheet tray 260 by the selector unit 500. This operation is the same as that of a conventional copying machine, and will not be described in greater detail.

Figure 9:
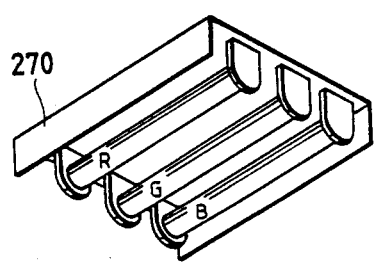
FIG. 9 is a perspective view of light sources in an exposure unit in the color image recording apparatus of the fifth embodiment.

(ii) The output of a single color image:

Based on mask member data of yellow, magenta, and cyan which are separated by an external device (not shown), mask members are successively produced on sheets of plain paper with toner by the laser printer B. First, the yellow mask member is fed by the selector unit 500 into the color printer C. The yellow mask member has a toner deposit on areas which are to be developed into yellow, and is brought into intimate contact with the photosensitive microcapsule sheet 900 supplied to and held in the exposure assembly 217a. Thereafter, the exposure unit 270 is moved in the direction of the arrow A in FIG. 7 to scan the photosensitive microcapsule sheet 900 while the light source B is energized to emit light having such a wavelength as to photoset only those microcapsules which will develop yellow. As shown in FIG. 9, the light sources R, G, B in the exposure unit 270 are selectively energized dependent on the mask member to be exposed. After the exposure, the mask member is discharged by the selector unit 215 onto the mask member discharge tray 280. The magenta and cyan mask members are also successively fed into the exposure assembly 217a, and the photosensitive microcapsule sheet 900 is exposed to light from the light sources R, G through the magenta and cyan mask members, which are then discharged onto the mask member discharge tray 280. In this manner, color latent images are successively formed on the photosensitive microcapsule sheet 900. Thereafter, the photosensitive microcapsule sheet 900 is fed to move the latent images into the pressure developing unit 230 by the takeup roll 210. In the pressure developing unit 230, the photosensitive microcapsule sheet 900 is superposed on a color developer sheet 220 supplied from the color developer sheet feed unit 240 to develop a color image under pressure. The color developer sheet with the visible color image is then discharged onto a color image sheet discharge tray 290.

(iii) The output of a plurality of identical color images:

The mask members which have been exposed in intimate contact with the photosensitive microcapsule sheet 900 in the above process are not discharged onto the tray 280, but are passed through the sheet feed passage 220a by the selector unit 215 so as to circulate through the color printer C a desired number of times. The sheet feed passage 220a has a length which is at least twice the length of each mask member. A desired number of color images can be produced by repeating the above process of producing a single color image. After the mask members have been produced by the laser printer B, the laser printer B can operate independently of the color printer C. Therefore, even while a color image is being produced by the color printer C, the laser printer B can produce a monochromatic image.

(iv) The output of a color image from mask members which have been in storage:

Mask members are successively inserted via the manual insertion tray or slot 310 into the color printer C to output a color image through the same process as described above in (i). In this mode, the laser printer B can operate independently of the color printer C.

In the fifth embodiment, monochromatic printers of other types may also be used in place of the laser printer B.

According to the fifth embodiment, as described above, the rate of production of a plurality of the same color images is increased, and the monochromatic printer can operate independently of the color printer in some modes. Therefore, while the color printer is in operation, the monochromatic printer may produce a monochromatic image, with the result that the efficiency of the entire color image recording apparatus can be increased.

Figure 11:
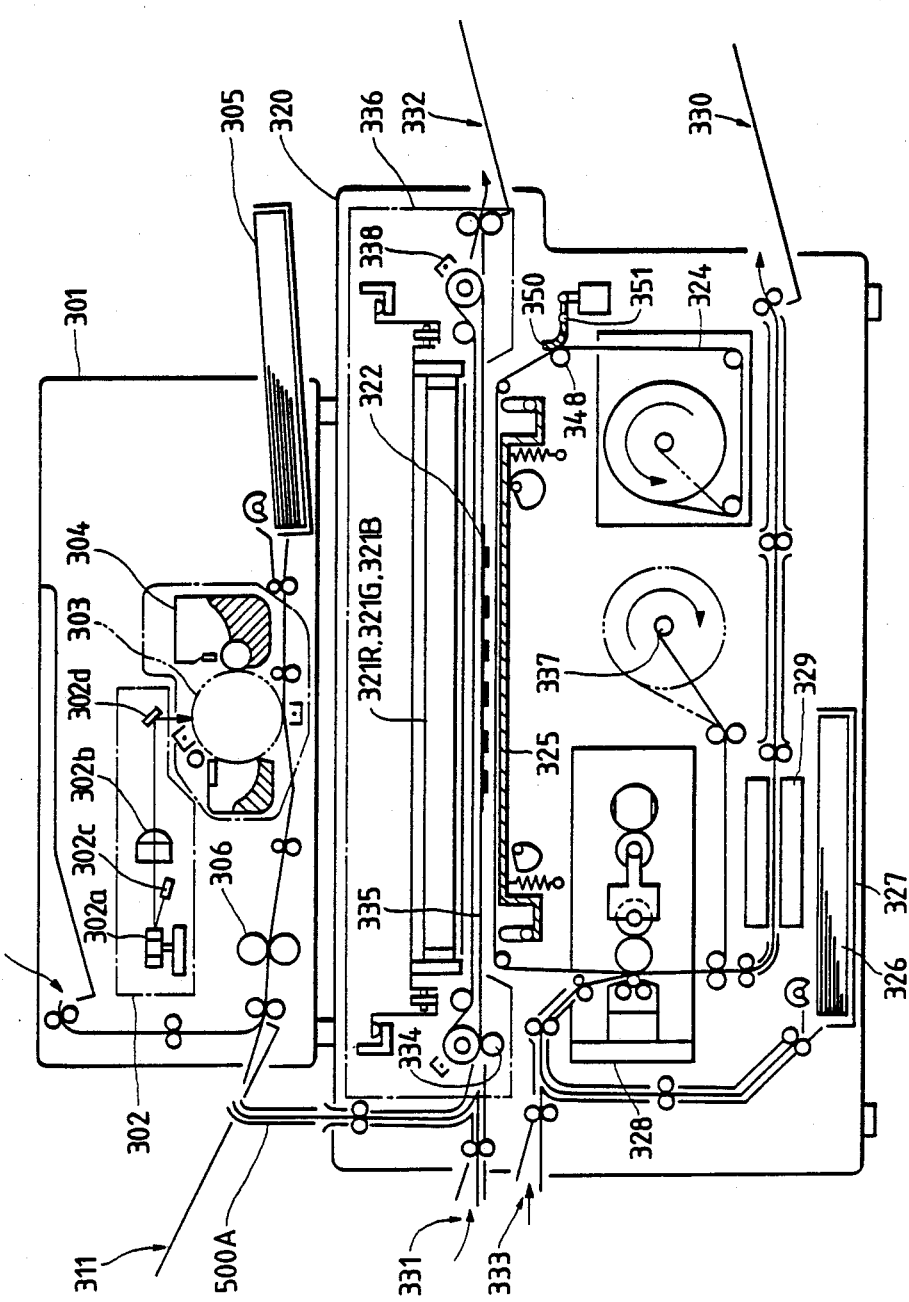
FIG. 11 is a schematic sectional elevational view of a color image recording apparatus according to a sixth embodiment of the present invention.

FIG. 11 schematically shows a color image recording apparatus according to a sixth embodiment, which is coupled to a monochromatic printer.

In the sixth embodiment, the monochromatic printer comprises a monochroimatic laser printer 301. The laser printer 301 includes a laser scanner unit 302 having a polygonal scanner 302a, an f0 lens 302b, a semiconductor-laser 302c, a planar mirror 302d, and other components. Since the laser scanner unit 301 is known in the art, it will not be described in detail.

The polygonal scanner 302a applies a laser beam to a charged photosensitive body 303 to form an electrostatic latent image thereon. The electrostatic latent image on the photosensitive body 303 is then developed into a visible toner image by an image developing unit 304, and the toner image is transferred onto a sheet of plain paper or an OPH sheet supplied from a sheet cassette 305, after which the toner image is fixed to the sheet by a fixing unit 306. The monochromatic laser printer 301 is normally operated to record data transmitted from a host computer. The monochromatic laser printer 301 discharges the sheet with the fixed black-and-white image onto a monochromatic image sheet discharge tray 311 or 312.

The color image recording apparatus 320 of the sixth embodiment records a color image by employing mask members produced on the basis of color image information.

More specifically, the color image recording apparatus 320 has a sheet path selector 500A for supplying mask members or intermediate sheets 322R, 322G, 322B produced from the monochromatic laser printer 301 into an exposure unit 336, an exposure table 325 on which the intermediate sheet 322 is held in intimate contact with a microcapsule sheet or photosensitive pressure-sensitive sheet 324, exposure light sources 321R, 321G, 321B of three primaries, a color developer sheet storage unit 327 for storing color developer sheets 326 each coated with a color developer which can develop colors in reaction with dye precursors contained in the microcapsules coated on the photosensitie pressure-sensitive sheet 324, a pressure developing means 328 for pressing a color developer sheet 326 and the photosensitie pressure-sensitive sheet 324 together in overlapping relation to rupture those microcapsules which have not been photoset for thereby developing a color image on the color developer sheet 326, a thermal fixing unit 329 for promoting color development, a color image sheet discharge tray 330, a manual insertion tray 331 for allowing an intermediate sheet to be manually inserted into the apparatus 320, an intermediate sheet discharge tray 332 for receiving an exposed intermediate sheet 322 discharged from the apparatus 320, and a manual insertion tray 333 for allowing a color developer sheet to be manually inserted into the apparatus 320.

Figure 12:
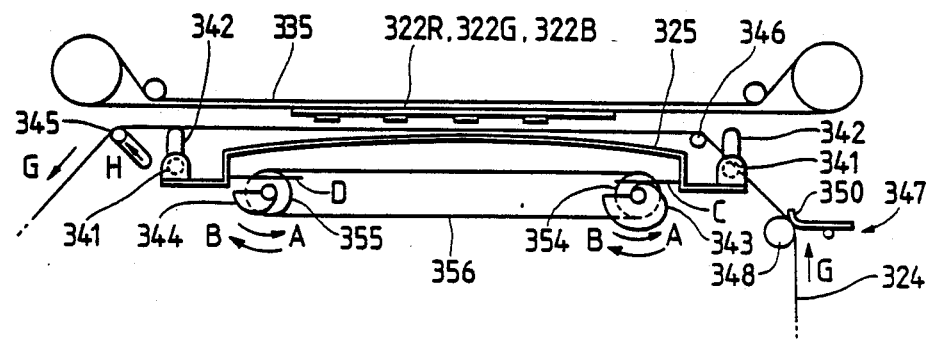
FIG. 12 is a schematic sectional elevational view of an exposure table assembly in the color image recording apparatus according to the sixth embodiment.
Figure 13:
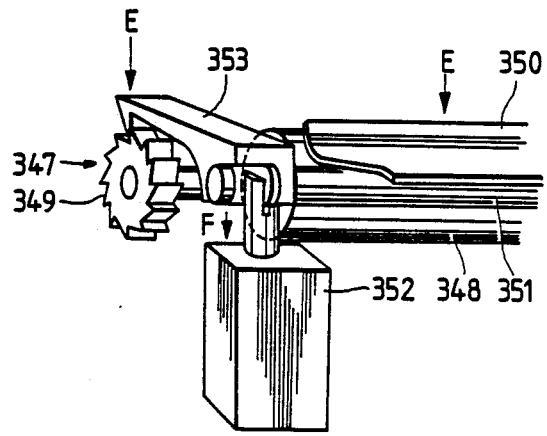
FIG. 13 is a fragmentary perspective view of a gripper means in the color image recording apparatus according to the sixth embodiment.

An exposure table assembly including the exposure table 325 and associated parts will be described with reference to FIGS. 12 and 13.

The exposure table 325 is of a curved configuration which is convex upwardly. The exposure table assembly includes pins 341 on the opposite ends of the exposure table 325, guide slots 342 defined in a frame for sliding movement of the pins 341 therein, first and second cams 343, 344 mounted as moving means below the exposure table 325 for vertically displacing the latter, a first cam follower C engaged by the first cam 343 for moving the exposure table 325 upwardly, a second cam follower D engaged by the second cam 344 for moving the exposure table 325 upwardly, a driver pulley 354 to which the first cam 343 is coaxially fixed, a driver pulley 355 to which the second cam 344 is coaxially fixed, a wire rope trained around the driver pulleys 354, 355 for rotating them synchronously, a tension roller 345 slidably disposed in a guide slot defined in the frame and movable in the direction of the arrow H, an idler roller 346 rotatably mounted on the frame for guiding the photosensitive pressure-sensitive sheet 324, and a gripper means 347 disposed rightwardly (FIGS. 11 and 12) of the exposure table 325 for gripping the photosensitive pressure-sensitive sheet 324. The second cam 343 is larger than the first cam 344, so that the second cam 343 engages the cam follower C earlier than the first cam 344 engages the cam follower D. As shown in FIG. 13, the gripper means 347 comprises a rubber roller 348, a ratchet wheel 349 fixed coaxially to the shaft of the rubber 348, a presser 350 for frictionally sandwiching the photosensitive pressure-sensitive sheet 324 between itself and the rubber roller 348, a pivot shaft 351 to which the presser 350 is fixed, a solenoid 352 for turning the pivot shaft 351 about its own axis, and a pawl 353 mounted on the pivot shaft 351 for engagement with the ratchet wheel 349.

A color mode of operation will be described below. In the color mode, a mask member 322R produced by the monochromatic laser printer 301 is passed through the intermediate sheet path selector 500A toward a positioning roller 334 by which the leading end of the mask member 322R is positioned. The mask member 322R is electrostatically attached to an insulating sheet carrier 355 such as of PET trained around rollers by an electrostatic charge generator 338 such as a corotron, and is then fed into the exposure unit 336. By moving the sheet carrier 335, the mask member 322R can be positioned so that color latent images on the photosensitive pressure-sensitive sheet 324 will not be shifted out of mutual registration. In the exposure unit 336, the mask member 322R and the photosensitive pressure-sensitive sheet 324 are held in intimate contact with each other.

After the photosensitive pressure-sensitive sheet 324 has been moved in the direction of the arrow G (FIG. 12), a non-image area of the photosensitive pressure-sensitive sheet 324 is gripped by the gripper means 347. While the photosensitive pressure-sensitive sheet 324 is in motion, the armature of the solenoid 353 is attracted in the direction of the arrow F (FIGV. 13) to turn the pivot shaft 351 about its own axis for thereby moving the presser 350 apart from the rubber roller 348 and disengaging the pawl 353 out of engagement with the ratchet wheel 349, whereupon the rubber roler 348 is free to rotate. For gripping the photosensitive pressure-sensitive sheet 324, the solenoid 353 is de-energized and the presser 350 and the pawl 353 are displaced in the direction of the arrow E by a biasing means (not shown) to make the rubber roller 348 immovable. The photosensitive pressure-sensitive sheet 324 is now gripped against movement between the rubber roller 348 and the presser 350.

Thereafter, the driver pulley 354 is rotated in the direction of the arrow A (FIG. 12) by a non-illustrated rotating means. The first cam 343 coaxially fixed to the driver pulley 354 is also rotated in the same direction, and so are the driver pulley 355 and the second cam 344 coaxially fixed thereto through the wire rope 356. Since the first cam 343 and the second cam 344 have different cam profiles, the exposure unit 325 is raised such that after the cam follower C thereof has reached its uppermost position, the cam follower D starts to be elevated. The upwardly convex curved shape of the exposure table 324 causes the photosensitive pressure-sensitive sheet 324 and the mask member 322R to be brought into intimate contact progressively from the cam follower C toward the cam follower D. When the photosensitive pressure-sensitive sheet 324 and the mask member 322R are fully held in contact with each other, the photosensitive pressure-sensitive sheet 324 is exposed to light from the light source 321R through the mask member 322R to form a latent image corresponding to the mask member 322R on the photosensitive pressure-sensitive sheet 324. After the exposure, the first cam 343 and the second cam 344 rotated in the direction of the arrow B to cause the exposure table 325 to separate the photosensitive pressure-sensitive sheet 324 from the mask member 322R progressively from the cam follower D. At this time, the photosensitive pressure-sensitive sheet 324 is prevented from being slacked by the tension roller 345 displaced in the direction of the arrow H.

The mask member 322R is then discharged onto the intermediate sheet discharge tray 332. The mask members 322G, 322B are then successively introduced into the color image recording apparatus 320 and processed in the same manner as described above with reference to the mask member 322R to form color latent images on the photosensitive pressure-sensitive sheet 324.

During this time, the photosensitive pressure-sensitive sheet 324 is firmly gripped by the gripper means 347. Thereafter, the solenoid 352 is energized to allow the photosensitive pressure-sensitive sheet 324 to move into the pressure developing means 328 in which the sheet 324 is superposed on a color developer sheet 326. The latent images on the photosensitive pressure-sensitive sheet 324 are developed into a visible color image on the color developer sheet 326, which is then discharged through the thermal fixing unit 329 onto the color image sheet discharge tray 330. The used photosensitive pressure-sensitive sheet 324 is wound up by a takeup shaft 337.

The monochromatic printer 301 is not limited to the laser printer, but may be an LED printer, a liquid crystal printer, a thermal transfer printer, or any of various other printers insofar as it can produce mask members of three primaries. Where the monochromatic printer 301 is of the desk top type, it is mounted on the top of the color image recording apparatus. Where the monochromatic printer 301 is larger in size, it may be located on the side of the color image recording apparatus 320, and mask members of three primaries produced thereby may be supplied through the manual insertion tray 331 into the apparatus 320 for recording a color image.

The photosensitive pressure-sensitive sheet 324 may be a self-coloring photosensitive pressure-sensitive sheet composed of a transparent resin base coated with pressure-rupturable microcapsules encapsulating dye precursors of basic rolors and a photosetting resin, and also with a color developer which can develop colors in reaction with the dye precursors.

The photosensitive pressure-sensitive sheet 324 may be replaced with a thermosensitive recording sheet which can develop color in response to the application of heat thereto.

A photosensitive pressure-sensitive recording sheet coated with microcapsules encapsulating a dye precursor of black, yellow, magenta, or cyan may be employed to provide a monochromatic image recording apparatus.

The exposure table may be made of an elastomeric material so that the exposure table can be elastically deformed to provide an upwardly convex configuration.

With the sixth embodiment, there is no friction between the mask member and the photosensitive recording medium when they are brought into intimate contact with each other. Therefore, the photosensitive recording medium is protected from damage. By holding the mask member and the photosensitive recording medium in intimate contact with each other during exposure, a clear image can be recorded on the photosensitive recording medium.

Figure 14:
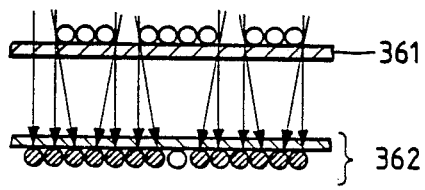
FIG. 14 is a fragmentary cross-sectional view explaining a disadvantage which arises when light is applied to a photosensitive recording medium through a light-transmissive member spaced therefrom.

If a light-transmissive member 361 and a photosensitive recording medium 362 were spaced from each other as shown in FIG. 14, rather than being held in intimate contact with each other, diffusive light applied to the photosensitive recording medium 362 through the light-transmissive member 361 in a second exposure unit would be diffused or spread, and the image formed on the photosensitive recording medium 362 would be blurred. The intimate contact between photosensitive recording medium and the mask member according to the present invention can eliminate such a shortcoming.

Figure 15:
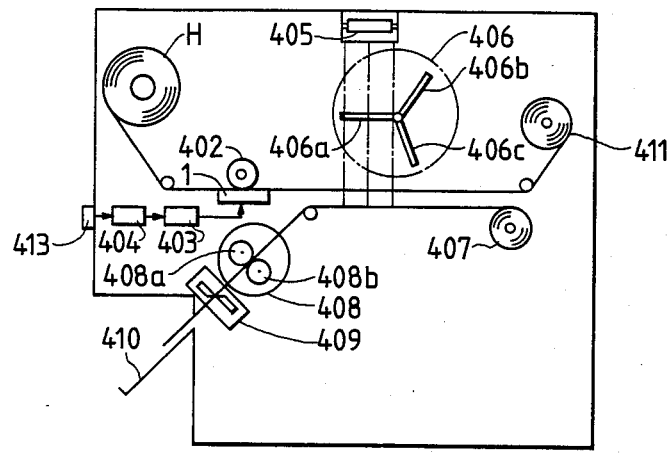
FIG. 15 is a schematic sectional elevational view of a color image recording aparatus according to a seventh embodiment of the present invention.
Figure 16:
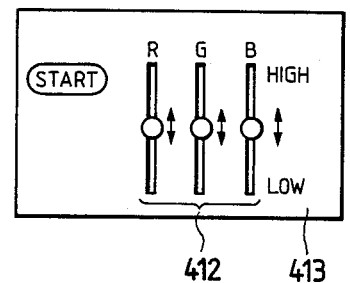
FIG. 16 is a plan view of density adjusting levers in the color image recording apparatus according to the seventh embodiment.

A seventh embodiment according to the present invention will next be described with reference to FIGS. 15 and 16. In the seventh embodiment, a thermosensitive sheet H of paper is used as a coloring member.

A color image recording apparatus of the seventh embodiment primarily includes a mask member forming means comprising a thermal head 401 and a platen 402, an exposure means comprising a light source 405 and a filter assembly 406, an image developing means comprising a pressure fixing unit 408, and a mask member density adjusting means comprising density adjusting levers 412. The filter assembly 406 has first, second, and third filters 406a, 406b, 406c.

First, image data of red which has been supplied is transmitted through a data input unit 404 and a control unit 403 to the thermal head 401 which records the image data on the thermosensitive sheet H which is gripped between the thermal head 401 and the platen 402. The thermosensitive sheet H is coated with microcapsules which encapsulate dyes. The thermosensitive sheet H develops color with a dye flowing out of those microcapsules which are ruptured by the heat applied by the thermal head 401. Likewise, image data of green is also recorded on the thermosensitive sheet H at a position spaced a certain pitch leftwardly from the position where the red image data has been recorded. Then, image data of blue is recorded on the thermosensitive sheet H at a position spaced a certain pitch leftwardly from the position where the green image data has been recorded. After three image data of red, green, and blue have been recorded monochromatically as mask members on the thermosensitive sheet H, these mask members are delivered to the right (FIG. 15). First, the red mask member is positioned directly below the light source 405. Below the mask members of the thermosensitive sheet H, there is disposed a photosensitive pressure-sensitive sheet 407 coated with microcapsules encapsulating coloring agents of basic colors of cyan, magenta, and yellow, with its phosensitive surface directed toward the mask members. Light emitted from the light source 405 is applied to the photosensitive pressure-sensitive sheet 407 through the red mask member and the first filter 406a which can transmit only light in the range of a wavelength of 350 nm which corresponds to the spectral peak sensitivity for cyan at the wavelength of 350 nm. Therefore, the cyan microcapsules on the photosensitive pressure-sensitive sheet 407 which are exposed to the light are photoset. Then, the thermosensitive sheet H is moved a prescribed pitch to the right to bring the green mask member over the photosensitive pressure-sensitive sheet 407. Now, the filter assembly 406 is rotated to position the second filter 406b below the light source 405, the second filter 406b being capable of transmitting only light in the range of a wavelength of 385 nm which corresponds to the spectral peak sensitivity for magenta at the wavelength of 385 nm. Light emitted from the light source 405 then passes through the second filter 406b and the green mask member to selectively photoset the magenta microcapsules on the sheet 407 according to the image data. Finally, the yellow microcapsules on the sheet 407 are selectively photoset by light applied from the light source 405 through the blue mask member and the third filter 306c capable of transmitting only light in the range of a wavelength of 475 nm which corresponds to the spectral peak sensitivity for yellow at the wavelength of 475 nm. The photosensitive pressure-sensitive sheet 407 is thus exposed to light through the red, green, and blue mask members. Then, the photosensitive pressure-sensitive sheet 407 is delivered into the pressure fixing unit 408 which has a pressure roll 408a and a confronting roll 408b that coact to press the photosensitive pressure-sensitive sheet 407. Those microcapsules on the sheet 407 which have not been photoset are ruptured by the applied pressure to release the coloring agents that produce a color image. The photosensitive pressure-sensitive sheet 407 is cut off to a desired length by a cutter 409, and the cut sheet is discharged onto a tray 410. The contrast of the output color image can be varied by shifting the density adjusting levers 412 (FIG. 16) on the control panel 413. More specifically, for obtaining a color image of higher contrast, the difference in brightness between highlights and shadows of the image on the sheet 407 should be increased. Therefore, the density of the printed area of the mask member should be increased in order to increase the difference between the transmittances of the printed and nonprinted areas of the mask member. For an image of lower contrast, the density of the image area of the mask member should be reduced. The coloring density of the thermosensitive sheet H can be varied by various parameters such as the type of the thermosensitive sheet H, the pressure between the platen 402 and the thermal head 401, the printing energy produced by the thermal head 401, and the like. In the present embodiment, the printing energy is controlled since it can adjust the density most stably. Generally, the printing energy E can be expressed by $E = R I^2 t$ where R is the resistance, I is the current, and t is the duration of a strobe printing pulse. For the control of the printing energy, therefore, the current or the strobe printing pulse duration should be used as a parameter. The following Table 1 shows the relationship between the densities of printed image areas on a photosensitive sheet, as measured by a Macbeth densitometer, and strobe printing pulse durations.

TABLE 1

| t | 0.8 | 0.7 | 0.6 | 0.5 | 0.4 | 0.3 |
|---|---|---|---|---|---|---|
| D | 1.25 | 1.11 | 0.90 | 0.72 | 0.45 | 0.16 | t: strobe printing pulse durations (ms), and
D: Macbeth densities.

The means for adjusting the density of a mask member by adjusting the transmittance of the mask member, as described above in relation to the seventh embodiment, may be incorporated in the first through sixth embodiments for reducing the time period required for exposure and eliminating the need for adjusting the amount of exposure.

The self-coloring photosensitive pressure-sensitive sheet as described above in the seventh embodiment may be replaced with a transfer-type photosensitive pressure-sensitive sheet. Mask members may be prepared by a laser printer, an electrophotographic printer, or the like which is capable of adjusting the image density, rather than using the thermosensitive sheet.

According to the seventh embodiment, since the contrast of an output image is adjusted by adjusting the density of mask members, the time period required for exposure can be reduced, and a complex process of adjusting the amount of exposure is not required.

In general image recording apparatus, the contrast of an output image is adjusted by adjusting the amount of exposure to a mask member. Therefore, the amount of exposure is reduced to lower the contrast, and increased to increase the contrast. The amount of exposure can be adjusted by either controlling time while keeping the amount of light from the light source at a constant level or controlling the output power from the light source. In the former adjusting process, a longer period of exposure time is needed for producing a image of a higher level of contrast, and sometimes several minutes must be spent to produce one image. According to the latter adjusting practice, the service life of the light source may be shortened since the current flowing therethrough is controlled.

The seventh embodiment of the present invention can overcome these drawbacks.

FIGS. 17 through 20 show a color image recording apparatus according to an eighth embodiment of the present invention. In this color image recording apparatus, photomask images of three primaries are produced by a printer based on desired image information, and combined into a color image on a photosensitive pressure-sensitive recording sheet.

Figure 17:
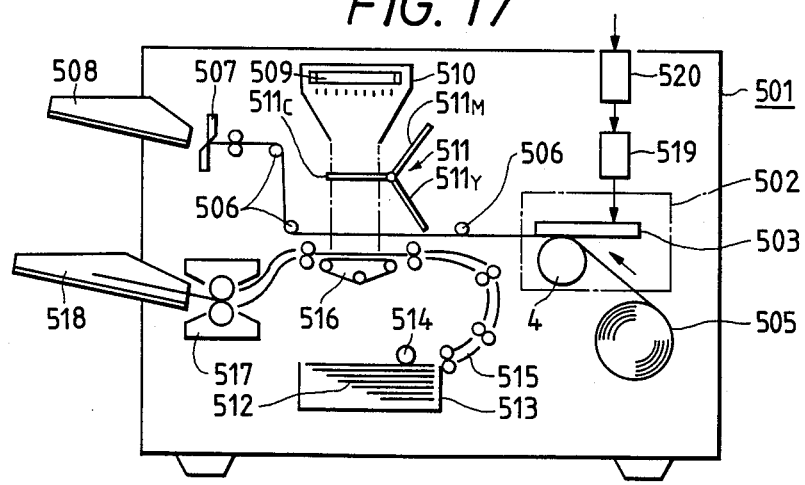
FIG. 17 is a schematic sectional elevational view of a color image recording apparatus according to an eighth embodiment of the present invention.

As shown in FIG. 17, the color image recording apparatus includes a printer for forming photomask images of red, green, and blue from given image information. The apparatus, generally denoted at 501, comprises a printer 502 having a thermal head 503 and a platen 504 disposed in confronting relation thereto for recording red, green, and blue images on a thermosensitive sheet 505 unwound as a light-transmissive image carrier from an uncoiling unit, based on input image data, guide rollers 506 for delivering the thermosensitive sheet 505 into an exposure unit and also to a sheet cutter 507, a sheet tray 508 for receiving sheets cut to suitable size by the sheet cutter 507, a sheet cassette 513 for storing photosensitive pressure-sensitive recording sheets 512 of cut size and supplying one, at a time, of the sheets 512 through a feed roller 514, a sheet guide 515 for guiding the supplied photosensitive pressure-sensitive recording sheet 512 into the exposure unit, a sheet holder 516 for holding the sheet 512 in the exposure unit, a light source 509 for emitting light of wavelengths corresponding to images of three primaries, a light-shielding casing 510, a color-separation filter assembly 511 having three red, blue, and green filters 511C, 511M, 511Y for passing the wavelengths of the three primaries, a pressure developing unit 517 for developing a color image on the exposed photosensitive pressure-sensitive recording sheet 512 under pressure, and a sheet tray 518 for receiving an storing a sheet with a reproduced color image thereon.

Figure 19:
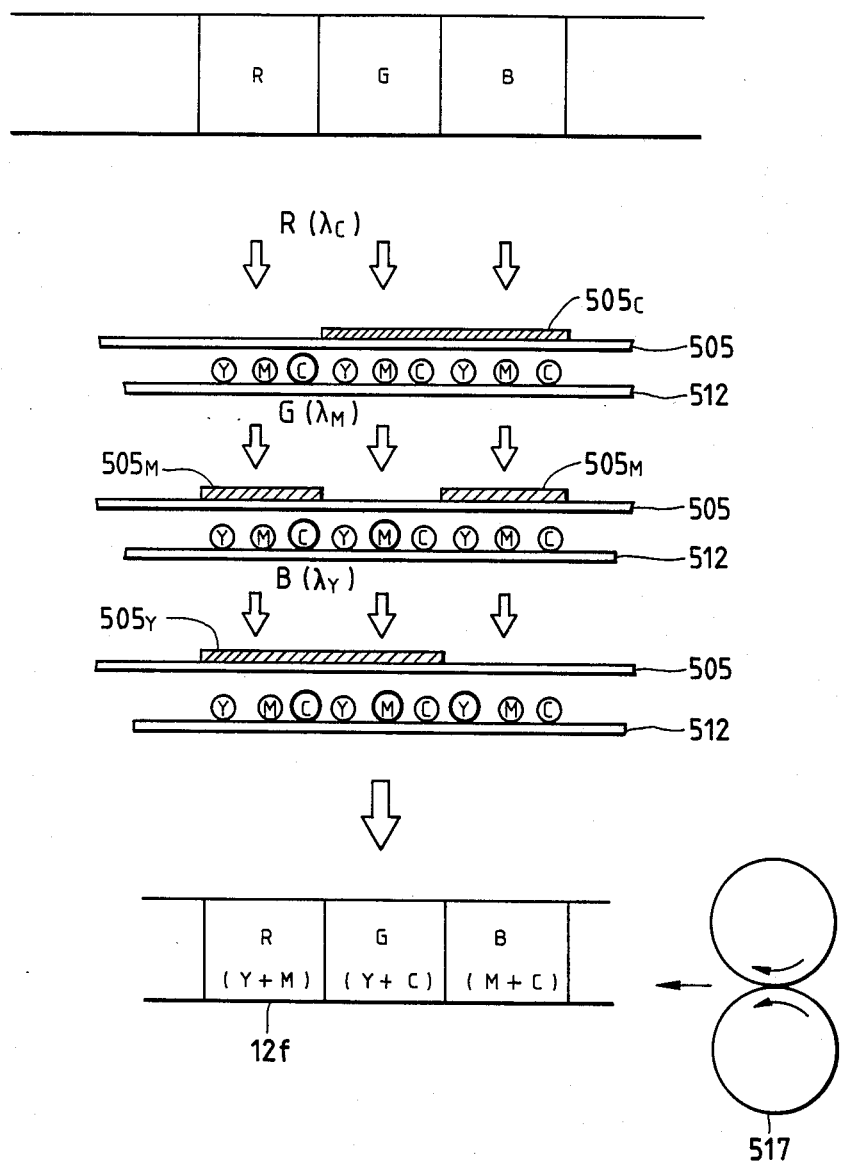
FIG. 19 is a schematic view illustrating color development after microcapsules on a photosensitive pressure-sensitive sheet have been exposed to light and photoset.
Figure 20:
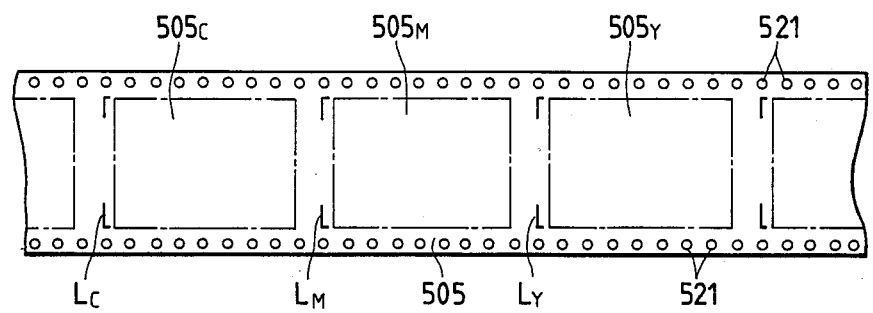
FIG. 20 is a fragmentary view showing the manner in which images of three primaries are recorded on a thermosensitive sheet by a thermal head.

The color image recording apparatus shown in FIG. 17 operates as follows:

In a color copying machine, generally, image data of red, green, and blue are extracted from a color original by an input device or a reader mechanism, and a color image is reproduced on the basis of the image data. For the sake of brevity, such an input device or a reader mechanism is omitted from illustration. First, red image data is supplied to the thermal head 503 through the input unit 520 and the control unit 519 and recorded on the thermosensitive sheet 505 gripped between the thermal head 503 and the platen 504. Thereafter, green and blue image data are successively recorded on the thermosensitive sheet 505 in the same manner. As shown in FIG. 19, the photosensitive pressure-sensitive sheet 512 is coated with a mixture of three types of microcapsules having a particle diameter of about 10 micrometers or less, i.e., microcapsules C for developing cyan color which are photoset upon exposure to light of a wavelength C=650 nm, microcapsules M for developing magenta color which are photoset upon exposure to light of a wavelength M=550 nm, and microcapsules Y for developing yellow color which are photoset upon exposure to light of a wavelength Y=450 nm. Below the coated microcapsule layer, the sheet 512 is coated with a color developer which will develop colors when mixed with colorless dyes encapsulated in the microcapsules C, M, Y. More specifically, when the microcapsules C are ruptured, the colorless dye is released and mixed with the color developer to develop the color of cyan. When the microcapsules M, Y are ruptured, the colorless dyes are released and mixed with the color developer to develop the colors of magenta and yellow, respectively. One of the photosensitive pressure-sensitive sheets 512 is supplied from the sheet cassette 512 by the feed roller 514, guided through the sheet guide 515, and then held on the sheet holder 516. Then, a red image 505C recorded on the thermosensitive sheet 505 is positioned above the sheet 512 on the sheet holder 516, and the sheet 512 is exposed to light emitted from the light source 509 and transmitted through the filter 511C which passes only light of a wavelength of 650 nm. While the photosensitive pressure-sensitive sheet 512 is held at rest, the color-separation filter assembly 512 is turned to bring the filter 511M which passes only light of a wavelength of 550 nm below the light source 509. A green image 505G is placed over the sheet 512, which is then exposed to light having passed through the green image 505M and the filter 511M. Similarly, the sheet 512 is exposed to light having passed through a blue image 505Y adn the filter 511Y. Latent images are now formed on the photosensitive pressure-sensitive sheet 512 based on the image data by exposing the sheet 512 to the light three times. Thereafter, the photosensitive pressure-sensitive sheet 512 is sent to the pressure developing unit 517 in which it is pressed to rupture those microcapsules which have not been photoset, whereupon the colorless dyes flowing out of the ruptured microcapsules are mixed with the color developer to form a color image which is identical to the color original. The recording sheet 512 with the color image thereon is discharged onto the sheet tray 518. Now, the cycle of reproducing the color image is completed.

The process of photosetting microcapsules and color development will be described with reference to FIG. 19. In the first exposure step, the image 505C obstructs light form the light source, but only those microcapsules C which are sensitive to the wavelength C among the microcapsules below the area free of the image 505C are photoset, while the other microcapsules M, Y do not react to the wavelength C. In the second exposure step, only the microcapsules M below the area free of the image 505M are photoset, and in the third exposure step, only the microcapsules Y below the area free of the image 505Y are photoset. The exposed microcapsules are set or made unrupturable through chemical reaction, whereas the unexposed microcapsules remain soft or rupturable. When the sheet 512 enters the pressure developing unit 517, the unexposed microcapsules are ruptured to release the colorless dyes which are mixed with the color developer and also mixed with surrounding microcapsules for thereby reproducing the colors of the color original.

For a wider range of applications of the apparatus, the printer 502 should not only produce the photomask images or mask members or three primaries but also be used as an output terminal of a personal computer. Switching between the generation of photomask images of three primaries and the production of monochromatic images or data recording will be described with reference to the flowchart of FIG. 18 and also FIG. 20. Such switching may be instructed throgh a control panel, or a signal indicative of a particular mode may be transmitted when image data is entered. If the reproduction of a color image is instructed on the control panel, when red image data is entered, an image positioning mark LC is recorded on the recording sheet 505, and then a red image 505C is recorded in slightly spaced relation to the image positioning mark LC. Then, a next image positioning mark LM is recorded on the recording sheet 505 with a required minimum space left between the red image 505C and the image positioning mark LM, and thereafter a green image 505M is recorded in slightly spaced relation to the image positioning mark LM. An image positioning mark LY and a blue image 505Y are similarly recorded. These images are then supplied into the exposure unit. The thermosensitive recording sheet 505 has perforations 521 defined in its opposite marginal edges. The perforations 521 are engaged by a tractor feed mechanism (not shown) for feeding and positioning the thermosensitive sheet 505 highly precisely. Where monochromatic image data is entered, the control panel is operated upon, and the entered image is recorded on the thermosensitive sheet 505 in the printer 502. Then, the thermosensitive sheet 505 is delivered through the exposure unit to the sheet cutter 507 which cuts off the sheet 505 into a suitable image size such as A4 size which is thereafter discharged onto the sheet tray 508. The thermosensitive sheet 505 with the photomask images 505C, 505M, 505Y of the three primaries may be cut off to a length on which the images 505C, 505M, 505Y are joined, or, if the sheet 505 is no longer necessary, it may be shredded by the sheet cutter 507 for disposal.

Figure 18:
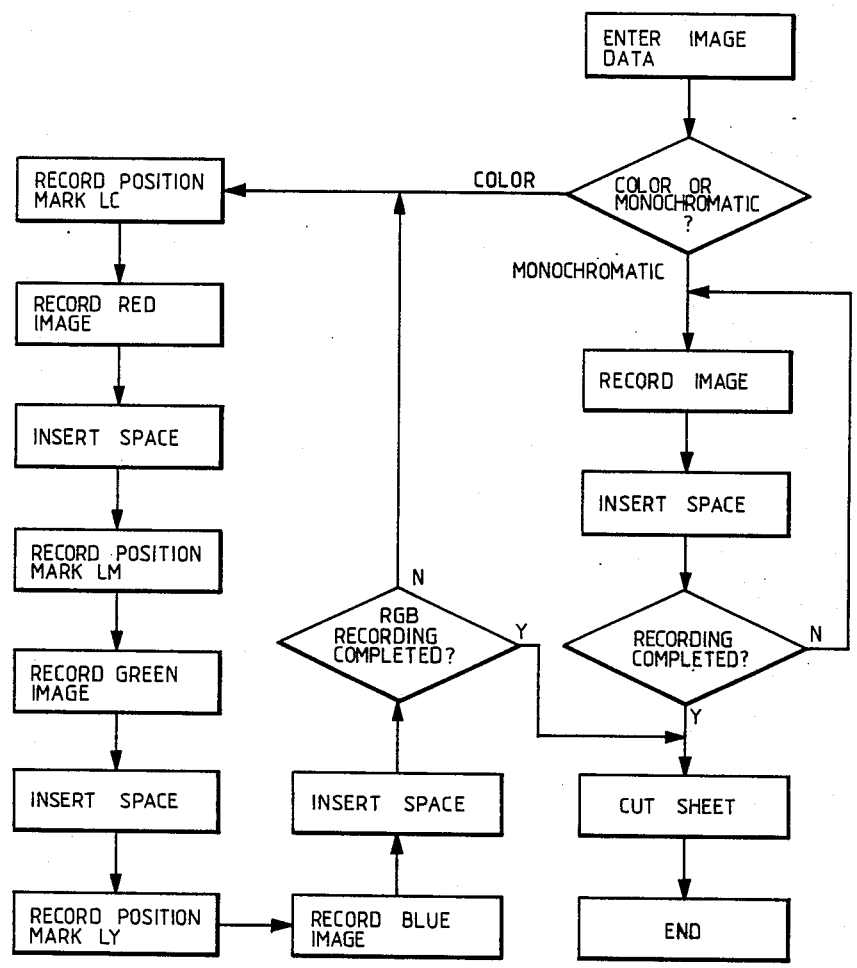
FIG. 18 is a flowchart of an image recording process using a thermal head for selectively recording color and monochromatic images.
Figure 21:
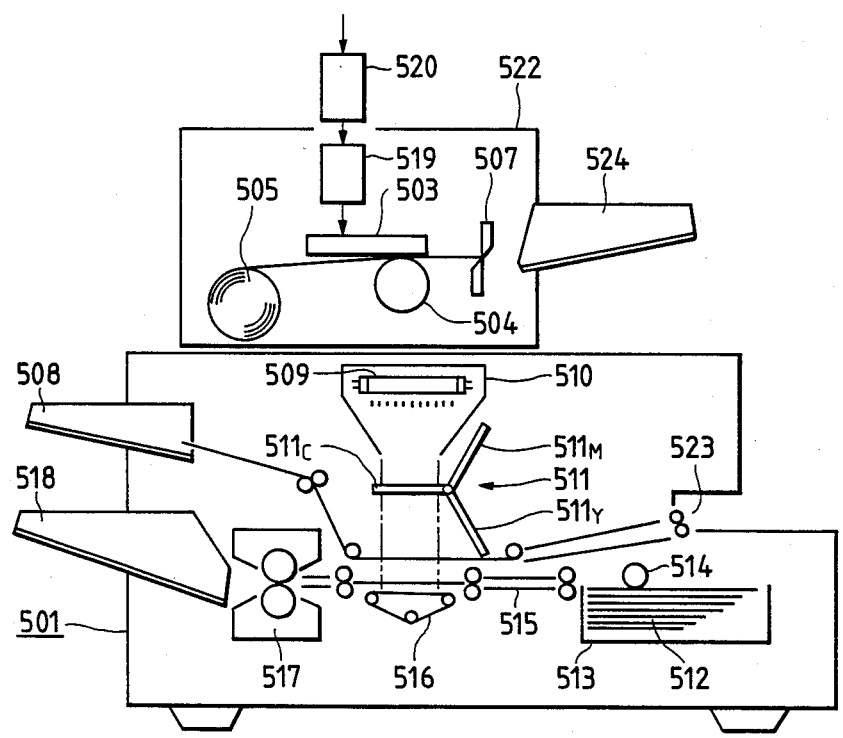
FIG. 21 is a schematic sectional elevational view of a color image recording apparatus according to a ninth embodiment of the present invention.

A ninth embodiment of the present invention is shown in FIG. 21. A printer 522 for producing mask members or photomask images is positioned outside of a color image recording apparatus 501. Mask members produced by the printer 522 are manually inserted by the user into the apparatus 501 through a manual insertion slot 523 to the reproduction of a color image. Those parts shown in FIG. 21 which function in the same manner as those of FIG. 18 are identified by identical reference numerals, and will not be described in detail. The structural details of the ninth embodiment are substantially the same as those of the eighth embodiment except that the printer 522 is not housed in the apparatus 501, as described above. When photomask images 505C, 505M, 505Y of the three primaries are produced, the thermosensitive sheet 505 is cut off into a length on which the images 505C, 505M, 505Y, and the cut sheet length 505 is discharged onto a sheet tray 524. Then, the perforations 521 of the cut sheet 505 are engaged by a sheet feeder (not shown), and the cut sheet 505 is inserted through the sheet insertion slot 523 into the apparatus 510 with the red image 505C ahead. Position sensors (not shown) in the apparatus 510 then detect the image positioning marks LC, LM, LY to position the three photomask images highly accurately for reproducing a desired color image. For producing a monochromatic image, the printer 522 records one image on the sheet 505, which is then cut off to a desired size such as A4, and the cut sheet is discharged onto the sheet tray 524.

Photomask images may be recorded on a sheet by an electrophotographic system, an ink jet recording system, a wire-dot matrix recording system, or the like, rather than by the thermosensitive recording system.

According to the ninth embodiment, a monochromatic photomask image and also photomask images for producing a color image can be produced. A series of joined photomask images for producing a color image may be cut off for storage, disposal, or color image reproduction.

Although certain preferred embodiments have been shown and described, it should be understood that many changes and modifications may be made therein without departing from the scope of the appended claims.

We claim:

1. An image recording apparatus comprising:
   a monochromatic printer for producing mask members;
   a color printer for exposing a photosensitive recording medium to light through said mask members to form color latent images on the photosensitive recording medium and developing the color latent images into a visibile color image; and
   means for introducing the mask members from said monochromatic printer selectively into said color printer.

2. An image recording apparatus according to claim 1, further comprising:
   a discharge member for discharging said mask members from said monochromatic printer toward outside; and
   a supply member for receiving said mask member from said monochromatic printer and supplying said mask members into said color printer, and wherein said means for introducing the mask members has selector means for selecting one of said discharge and supply paths at a time.

3. An image recording apparatus according to claim 1, further including control means for selectively synchronously and independently operating said monochromatic printer and said color printer.

4. An image recording apparatus according to claim 3, wherein said control means includes a mechanism for changing feed directions of said mask member, said mechanism being adapted to discharge said mask member toward outside through said discharge member when a monochromatic image is produced on said mask member by said monochromatic printer, and being adapted to supply said mask member toward said supply member when a mask image for color printing is produced on said mask member by said monochromatic printer.

5. An image recording apparatus according to claim 3, wherein said control means includes a second mechanism for changing feeding direction of said mask member, said second mechanism being adapted to feed said mask member in one direction when a single color image is to be produced by said color printer, and being adapted to feed said mask member in a second direction when a plurality of identical color images are to be produced by said color printer; a feed path associating with said second direction having a length at least twice as large as the length of the mask member for feeding the mask member back to an exposure unit in said color printer when the plurality of identical color images are to be produced.

6. An image recording apparatus according to claim 3, wherein said control means includes a mechanism for allowing a mask member to be inserted directly into said color printer.

7. An image recording apparatus according to claim 1, wherein said color printer comprises:
   feed means for feeding the mask members which have light-shielding images on light-transmissive members into an exposure position;
   said photosensitive recording medium supplied to said exposure position;
   exposure means for applying light to said photosensitive recording medium successively through said mask members in said exposure position to form the latent images on said photosensitive recording medium;
   developing means for developing the latent images on said photosensitive recording medium into the visible image;
   an exposure table disposed on a side of said photosensitive recording medium in said exposure position remotely from said mask members; and
   displacing means for displacing said exposure table to bring a portion thereof into contact with said photosensitive recording medium at first and then bring said portion progressively into contact with said photosensitive recording medium until the mask member and the photosensitive recording medium are held in intimate contact with each other.

8. An image recording apparatus according to claim 1, wherein said monochromatic printer includes mask member density adjusting means for adjusting the transmittance of said mask members.

9. An image recording apparatus according to claim 1, further including:
   means for determining whether entered image information is monochromatic or of color;
   means for separting the image information into a plurality of color data when the entered image information is of color;
   mask member forming means for successively forming the mask members which include light-shielding photomask images on an elongate light-transmissive image carrier based on the monochromatic image information or the color data;
   cutting means disposed in a discharge path for said image carrier for cutting off the image carrier; and
   control means for cutting off the monochromatic photomask image on the image carrier when the entered image information is monochromatic and for cutting off a series of joined color data photomask images on the image carrier when the entered image information is of color.

10. An image recording apparatus comprising:
    feed means for feeding mask members which have light-shielding images on light-transmissive members into an exposure position;
    a photosensitive recording medium supplied to said exposure position;
    exposure means for applying light to said photosensitive recording medium successively through said mask members in said exposure position to form latent images on said photosensitive recording medium;
    developing means for developing the latent images on said photosensitive recording medium into a visible image;
    an exposure table disposed on a side of said photosensitive recording medium in said exposure position remotely from said mask members; and
    displacing means for displacing said exposure table to bring a portion thereof into contact with said photosensitive recording medium at first and then bring said portion progressively into contact with said photosensitive recording medium until the mask member and the photosensitive recording medium are held in intimate contact with each other.

11. An image recording apparatus comprising:

mask member forming means for forming a mask member by recording applied image information on a recording medium;
exposure means for exposing a photosensitive recording medium to light through said mask member to form a latent image on the photosensitive recording medium;
developing means for developing said latent image on said photosensitive recording medium into a visible image; and
said mask member forming means including mask member density adjusting means for adjusting the transmittance of said mask member.

* * * * *